United States Patent
Dougherty, Jr. et al.

(10) Patent No.: US 7,373,615 B2
(45) Date of Patent: May 13, 2008

(54) METHOD FOR OPTIMIZATION OF LOGIC CIRCUITS FOR ROUTABILITY

(75) Inventors: William E. Dougherty, Jr., Pleasant Valley, NY (US); Victor Kravets, White Plains, NY (US); Prabhakar N. Kudva, New York, NY (US); Andrew J. Sullivan, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 10/780,140

(22) Filed: Feb. 17, 2004

(65) Prior Publication Data
US 2005/0183046 A1    Aug. 18, 2005

(51) Int. Cl.
*G06F 17/50* (2006.01)
(52) U.S. Cl. .................. 716/1; 2/4; 2/5; 2/10; 2/12; 2/18
(58) Field of Classification Search ............. 716/2, 716/6, 11–14, 18, 1, 4–5, 10
See application file for complete search history.

(56) References Cited

U.S. PATENT DOCUMENTS

| | | | |
|---|---|---|---|
| 6,006,023 A * | 12/1999 | Higashida ............... 716/6 |
| 6,543,041 B1 * | 4/2003 | Scheffer et al. .......... 716/10 |
| 6,836,877 B1 * | 12/2004 | Dupenloup .............. 716/18 |
| 2004/0068331 A1 * | 4/2004 | Cronquist ............... 700/18 |
| 2004/0068711 A1 * | 4/2004 | Gupta et al. ............. 716/18 |
| 2004/0210856 A1 * | 10/2004 | Sanie et al. ............. 716/2 |
| 2004/0230933 A1 * | 11/2004 | Weaver et al. ........... 716/12 |
| 2006/0095872 A1 * | 5/2006 | McElvain et al. ........ 716/1 |

* cited by examiner

*Primary Examiner*—Paul Dinh
(74) *Attorney, Agent, or Firm*—F. Chau & Associates, LLC

(57) ABSTRACT

Routability (or wiring congestion) in a VLSI chip is becoming increasingly important as chip complexity increases. Congestion has a significant impact on performance, yield, and chip area. The present invention targets the optimization of congestion early in technology independent synthesis prior to physical design. Instead of attempting to optimize the logic structure as well as the spatial placement of a circuit, we pose a more modest goal limiting such optimization to the scope of logic synthesis. That is, we propose an aggressive optimization approach that is cognizant of circuit structure during technology independent synthesis and produces more predictable implementations which give better routability and yield.

19 Claims, 10 Drawing Sheets

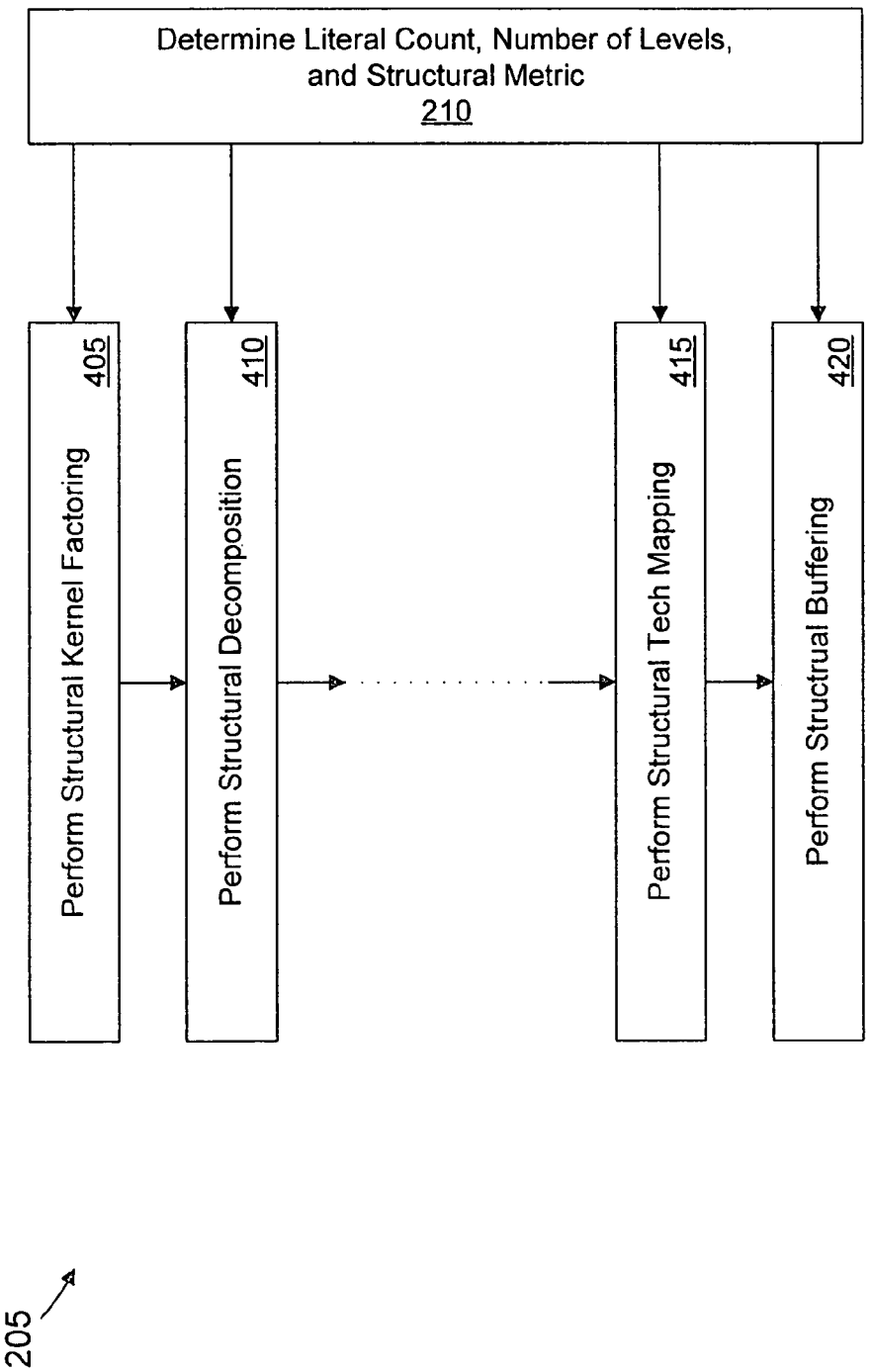

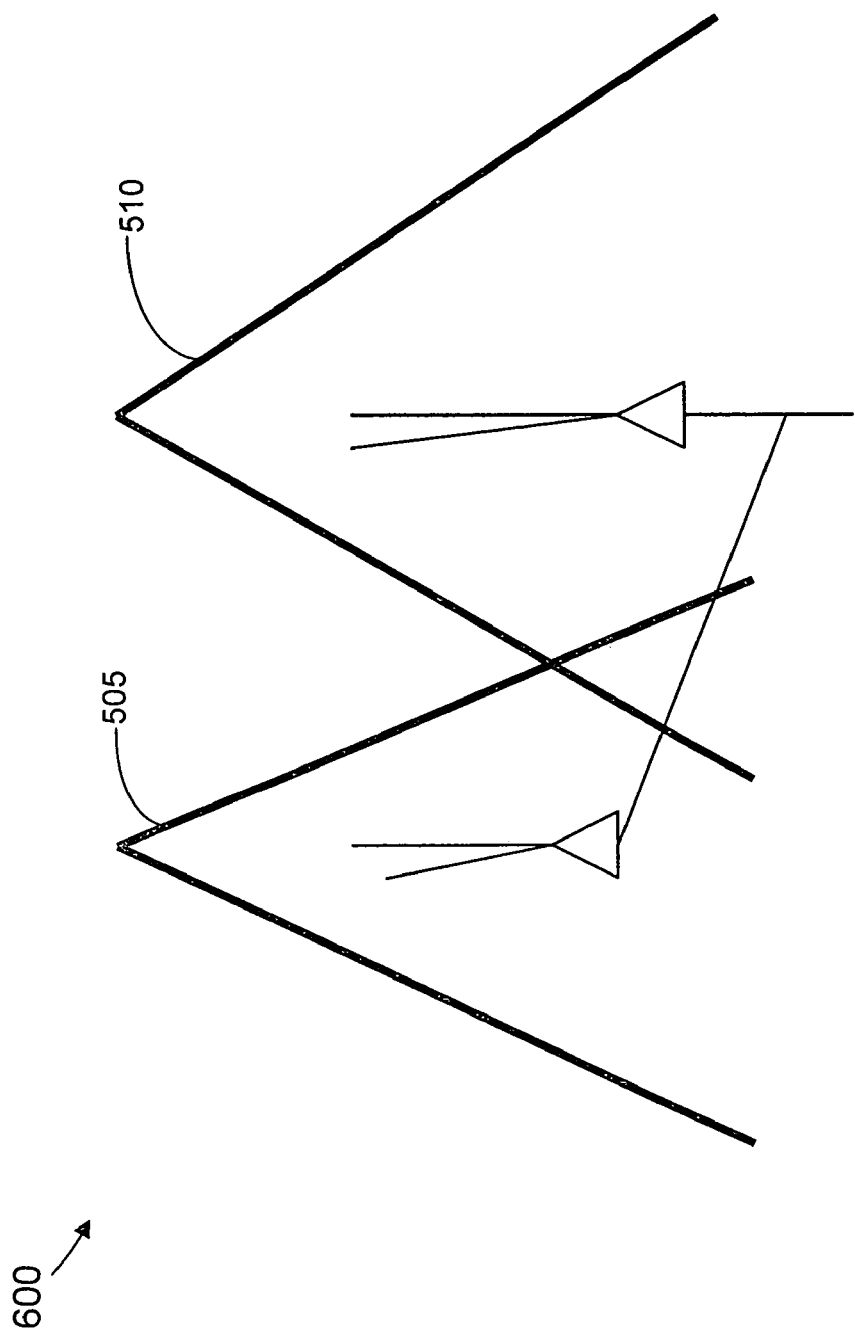

METHOD FOR OPTIMIZATION OF LOGIC CIRCUITS FOR ROUTABILITY

BACKGROUND OF THE INVENTION

1. Field of the Invention

The present invention relates to circuits and, more particularly, to electronic circuit design.

2. Description of the Related Art

A major goal in the design of Very Large Scale Integration ("VLSI") chips and other integrated circuits is to combine logic synthesis methods with physical design optimization methods to meet timing, area, and other design objectives of the chip. Physical design optimization methods include methods for placement and methods for routing. Logic synthesis methods determine the type and connectivity of circuits used to implement the functionality of the chip. Placement methods assign and alter the physical locations of the circuits on the chip. Routing methods modify the physical path and wire type of the connections between the circuits.

As the size of the VLSI chip grows, the problem of design closure increases correspondingly at a geometric rate. Design closure is the process of getting a chip design ready to be submitted for manufacturing. Design closure ensures that timing along all paths in the circuit operate at least as fast as some pre-defined speed in the presence of various electrical interactions, such as capacitive coupling. During this process, locations are selected for all of the components making up the design, and those components are connected or routed with some wiring resources.

A key design parameter that affects design closure significantly is routability of the circuit. The routability of the circuit is a measurement of the relative ease of making appropriate connections on the chip implementing the design. In some cases, this may be impossible to do; that is, the chip is said to be unroutable. However, when it is possible, the relative ease of making appropriate connections on the chip implementing the design is measured by the density of wiring resources that is required per unit area of the chip. This density measurement describes the wiring congestion on the chip. Routability (or wiring congestion) affects the performance, noise sensitivity, yield, area, and power of the design.

Two of the steps in the design closure process which are relevant here are logic synthesis and physical design. Logic synthesis transforms a textual representation of the design into a boolean representation, and maps the boolean representation down onto circuits and connections. The circuits and connections are the basic building blocks in which the physical design operates. Physical design takes the circuits and assigns them physical locations on the chip for implementing the design. The logical connections are converted into physical connections taking the form of wires and accompanying wiring paths between the connected elements.

Logical synthesis comprises two optimization stages: (1) a technology independent stage and (2) a technology dependent stage. Optimizations of the technology independent stage are independent on the type of technology that will be used to implement the design. On the other hand, optimizations of the technology dependent stage are dependent on the type of technology that will be used to implement the design. Each of these stages are comprised of a one or more optimization steps. The application of one of these steps is known as a transformation or transform The technology independent stage comprises transforming a register transfer level textual description of the design into a set of boolean equations. The set of boolean equations are then optimized for a set of given metrics such that they will, at the completion of all the steps in the full synthesis process including technology mapping and physical synthesis, lead to a good implementation for delay, area and power. Because the technology independent stage does not know the exact technological components that will be associated with the boolean equations, the optimizations in this stage must use measurements or metrics based on the equations to approximate the area and delay of the entire set of equations. The area is approximated with a literal count, which is a measure of the number of connections or edges in a graph representing all of the boolean equations. For example, assume a set of boolean equations for an output A would be of the form X=A and B, B=C and D. Here the literal count is 4 since the number of connections are 4. The connection between area and literal count is directly proportional, meaning that each literal is assumed to consume some positive, finite, yet unknown, amount of area. The technology independent optimizations attempt to minimize the amount of area that will be consumed by the equations because smaller implementations are more likely to fit within the area defined by a chip.

The delay of the design is approximated in the technology independent phase of logic synthesis by a number of levels in the boolean equation. A set of logic equations comprising a set of input signals and output signals may be represented by a graph with nodes (which represent gates) and edges (which represent connections) between the inputs and outputs. The paths between inputs and outputs comprises gates and connections encountered during a traversal of the graph from input to output. Each path comprises gates and connections. The number of levels for an output signal in the equation is the maximum number of connections from any given input signal to the output signal. There is a directly proportional relationship between delay and number of levels, meaning that each level is assumed to consume a positive and finite, yet unknown, amount of delay. The technology independent optimizations attempt to minimize the amount of delay that will be consumed by the equations because faster implementations are more likely to achieve design closure.

While the technology independent synthesis optimizations attempt to measure the size and speed of the circuit, no metrics exist to determine where the literals will be placed or how many wiring paths will want to follow similar routes, which correlates strongly with the routability of the design. So while the basic structure of the design implementation is defined by the form of the boolean equations at the end of the technology independent optimization phase, no attempt has been made to measure the wiring characteristics of the design.

The second stage of logic synthesis, which generally follows the technology independent optimization stage, is the technology dependent stage. In this stage, the boolean equations are mapped onto a set of gates that exist in some predefined technology specific library. This mapping has both logical and electrical components. The logical component says that all logic described in the boolean equations must be mapped to one or more gates, while the electrical component ensures that the electrical characteristics of the gate are not violated and that the desired speed of the design can be achieved. An example of an electrical characteristic is as follows: the amplitude of the signal transmitted from one gate is sufficiently large to cause a reaction when received by a connected gates. The strength of these transmitted signals also determines the speed at which the design will operate. This mapping to gates is done within the structure defined by the boolean equations coming out of the technology independent optimization stage of logic synthesis.

After this technology dependent mapping to gates has been completed, the physical design process can begin. Physical design consists of two main components, placement and routing. During placement, locations on a chip are assigned for each of the gates coming out of the technology dependent optimization phase of logic synthesis. Based on this placement, routing then creates physical wires between the connected gates. It is not until the locations of the gates are assigned that even a crude approximation can be made about the routability of the design. While delay receives attention early in the design process, if all of the connections between the design components cannot be made, the design cannot be implemented. Poor routability of the design also creates longer wires in the design, causing a degradation in timing. If the inability to route the design or the inability to meet timing due to poor routability is discovered only during the physical design process, a designer must return to the technology independent logic synthesis phase to alter the way the design was optimized. However, since those optimizations have no concept of a routability metric, it is difficult to direct those optimizations toward a criteria that cannot be measured.

Physical design information is generally not available early in the logic synthesis stage. Therefore, existing optimizations and transformations in the logic synthesis stage, which are primarily targeted towards timing and area, generally do not consider their impact on routability. Significant decisions regarding the circuit structure are made early in logic synthesis such as during the technology independent logic optimization step. Optimizations in this step use a literal count as a metric for optimization, and, therefore, do not adequately capture the intrinsic entanglement of the circuit. Two circuit design models with identical literal counts may have significantly different routability characteristics after physical design.

It is widely acknowledged that current electronic design automation must be able to handle the challenges and opportunities of finer-featured fabrication processes. These processes are fundamentally premised on the principle of separation of concerns in which a complex design flow is serialized into a sequence of manageable steps that are loosely coupled. In this scenario, decisions made in the early stages of design flow become binding constraints on later stages. Such serialization potentially gives less optimal designs than a process that simultaneously considers all design aspects. This is unavoidable, however, due to the practical infeasibility of concurrent optimization of all design parameters, and is deemed acceptable as long as the constraints that are fed forward by one step to the next can be met. The process breaks down, however, when these constraints become unsatisfiable (e.g., the chip becomes unroutable, and falls short of the expected yield). The typical action in such cases is to go back to the earlier steps and iterate through the steps so as to revisit earlier design stages to change suspected problematic decisions. Such iteration has become particularly necessary between the logic synthesis and placement steps.

Ideally, the time-wasting iteration between logic synthesis and placement in today's design methodologies could be eliminated by fusing these stages to simultaneously optimize the logical structure as well the spatial placement of a circuit.

Steps in technology dependent logic synthesis and placement have been combined to produce a wide variety of methods. Techniques which optimize both the logical and physical characteristics are referred to as physical synthesis Although, there is work in the area of physical synthesis that combines later stages of logic synthesis with placement, the early stages of logic synthesis are not adequately integrated with placement.

Wire planning evaluates the placement characteristics of circuits during logic synthesis and approaches the same problem from a different angle. The wire planning approach assumes that the locations of pins at the boundary of the region being optimized are known. Constraints are generated from placement models and synthesis is performed using the constraints. Although the locations of chip/partition Inputs/Outputs are typically available, assumptions about locations for pins surrounding the small region consisting of a few gates in which local optimizations (e.g., factorizations) are being performed is generally difficult to preserve during full chip placement.

Furthermore, statistical interconnect prediction methods (e.g., Rent's rule) do not distinguish between two networks which have the same number of connections. Interconnect estimates are based primarily on the number of circuits and IOs. Therefore, they are unsuitable as predictors for routability optimization during technology independent synthesis.

SUMMARY OF THE INVENTION

In one embodiment of the present invention, a method of optimizing a circuit design model during logic synthesis is provided. The method comprises creating a structural metric prior to physical design, the structural metric being proportional to the routability of the circuit design model after the physical design; and using the structural metric during logic synthesis to create an optimized circuit design model.

In another embodiment of the present invention, machine-readable medium having instructions stored thereon for optimizing a circuit design model during logic synthesis is provided. The instructions comprise the steps of creating a structural metric prior to physical design, the structural metric being proportional to the routability of the circuit design model after the physical design, and using the structural metric during logic synthesis to create an optimized circuit design model.

In yet another embodiment of the present invention, a system for optimizing a circuit design model during logic synthesis is provided. The system comprises means for creating a structural metric prior to physical design, the structural metric being proportional to the routability of the circuit design model after the physical design; and means for using the structural metric during logic synthesis to create an optimized circuit design model.

BRIEF DESCRIPTION OF THE DRAWINGS

The invention may be understood by reference to the following description taken in conjunction with the accompanying drawings, in which like reference numerals identify like elements, and in which:

FIG. 3B shows a flow diagram of the structural technology independent synthesis of FIG. 2, followed by structural technology mapping and structural buffering, in accordance with one embodiment of the present invention;

FIG. 4B shows a buffer tree constructed using the structural buffering of FIG. 3B, in accordance with one embodiment of the present invention;

DETAILED DESCRIPTION OF PREFERRED EMBODIMENTS

Figure 1:
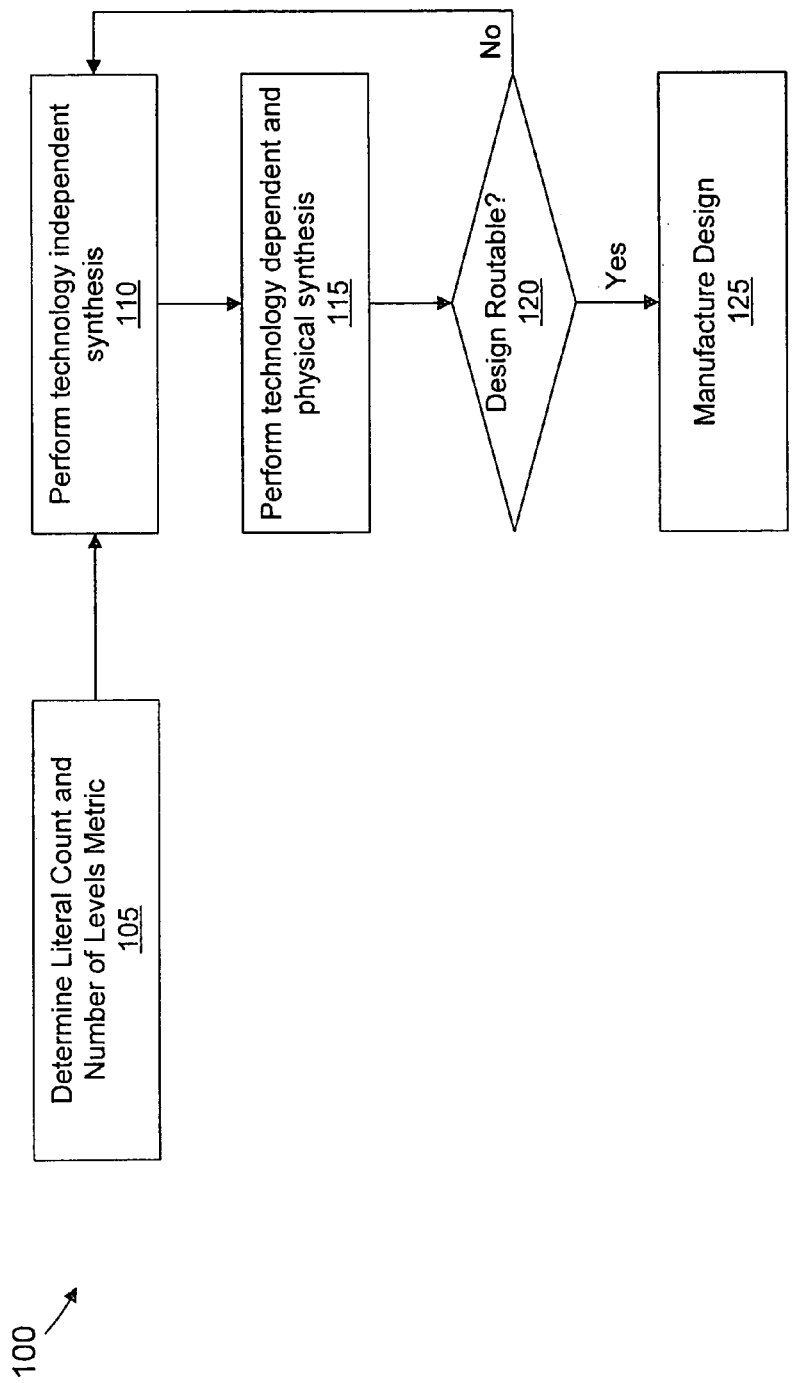
FIG. 1 shows a flow diagram of a prior art circuit design process.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

It is to be understood that the systems and methods described herein may be implemented in various forms of hardware, software, firmware, special purpose processors, or a combination thereof. In particular, the present invention is preferably implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying Figures are preferably implemented in software, the connections between system modules (or the logic flow of method steps) may differ depending upon the manner in which the present invention is programmed. Given the teachers herein, one of ordinary skill in the related art will be able to contemplate these and similar implementations of the present invention.

Routability (or wiring congestion) in a VLSI chip is becoming increasingly important as chip complexity increases. Congestion has a significant impact on performance, yield, and chip area. The present invention targets the optimization of congestion early in technology independent synthesis prior to physical design.

Instead of attempting to optimize the logic structure as well as the spatial placement of a circuit, we pose a more modest goal of optimization to the scope of logic synthesis. That is, we propose an aggressive optimization approach that is cognizant of circuit structure during technology independent synthesis and produces more predictable implementations which give better routability and yield.

One known method of improving routability is by reducing congestion based on placement models during the technology independent optimization phase of logic synthesis. This method typically uses placement models or makes assumptions regarding placement. The present invention, on the other hand, explores whether routability can be predicted and reduced in the technology independent phase without making any assumptions about placement. This is important because it is generally difficult to ensure that placement assumptions made in such prior art methods during the technology independent optimization stage can be realized during placement.

In the present invention, we propose metrics based only on the network graph that can predict congestion characteristics during optimization early in the design flow. The metric is based on the connectivity of the network graph implementing the logic function. It does not require constraint generation from placement models of the blocks and the use of such constraints in synthesis.

The structure, as measured by one or more of the metrics defined in this invention, of a circuit contributes significantly to the wiring congestion. We perform a prediction-based analysis at the early stages of logic synthesis, evaluating topological properties of the evolving circuit prior to its physical layout. By estimating circuit structure early in the design flow, we maintain the separation of concerns principle, while moderating costly optimizations at the later stage of physical synthesis.

The present invention includes an incremental structural metric process. The structural metric is initially computed on the entire logic network before any optimization is performed. During optimization, an incremental recalculation is performed on the design. The incremental engine tracks all the nodes affected by the changes to the design made by a given optimization. When change to the design is considered, the method checks to see if any of the nodes affected by the change have been invalidated by the structural analysis engine. If the cost metric on any of these nodes is invalid, then the cost is recomputed for these nodes. If the cost metric is valid, it is used in computing the cost of the proposed change. The change is then applied if the cost improves. Once the change is applied, the nodes affected by these changes are marked as invalid for the structural metric. Therefore, in this incremental structure analysis engine, recomputation is performed only as needed during optimization. Different structural cost measures may be computed by the incremental structure analysis engine. Among the choices, three different structural measures are described as embodiments. Additional structural metrics are possible and are covered within the scope of this invention.

The structural measures topological relationships in different circuit parts known as their adhesion. One structural measure is referred herein as a distance metric. The design is first represented as a graph with the circuits represented as nodes and the connections between them represented as edges. The distance metric applied to this graph, uses a concept of neighborhood population that is computed relative to a given circuit, and to a given distance k measured as graph-theoretic length of a shortest path between two nodes. For a given circuit c and distance k the neighborhood population is a set of circuits residing within k nodes away from c. The average neighborhood population at distance k is computed for a set of circuits, and is taken as the cumulative sum of their neighborhood population sizes divided by the total number of considered circuits. In general, large average neighborhoods for small values of k suggest that circuit topology is more entangled, and is therefore more likely to produce congested regions during its layout. In one embodiment of the invention, the method would query the distance metric from the incremental structural analysis engine and implement optimizations on the design that reduces average neighborhoods for smaller values of k.

Another structural measure is the sum of all pairs mincuts ("SAPMC") of the graph derived from the design. The process to obtaining the graph is identical to the process for the distance metric. To compute the SAPMC, the minimum number of edges cut in the graph to separate every pair of nodes in the graph are computed. This number for each pair of node is called the min-cut. The sum of the min-cuts for every pair of nodes in the graph is referred to as the SAPMC. In another embodiment of the invention, the method would query the SAPMC metric from the incremental structural analysis engine and implement optimizations on the design the total value of SAPMC.

A third structural measure is the shared expansion metric. First a graph for the design is obtained. The process to obtaining the graph is identical to the process for the distance metric. For each pairs of nodes, the number of shared nodes encountered at a distance k is computed The sum over all pairs of nodes for a given set of k values of shared nodes is known as the expansion of the design. In yet another embodiment of the invention, the method would query the expansion metric from the incremental structural analysis engine and implement optimizations on the design based on the expansion metric.

During technology independent optimization in this invention, transformations may propose a set of changes in the circuit design model. These changes are proposed as alternatives to the circuits in a region of the circuit design model based on boolean analysis of the region of the logic network. The cost of applying each change to the logic network is evaluated using the incremental structural metric process. The proposed change that yields the most improvement in cost is selected and applied.

For example, consider a kernel factoring algorithm. A traditional kernel factoring optimization identifies circuits or regions of the logic design that may be shared. In performing sharing, it would use as a cost metric the total number of literals or connections in the design to minimize. The structure driven kernel factoring would similarly identify circuits or regions of the logic design that may be shared, but it would do so to improve one of the structural metric costs. It would consider a possible sharing optimization. It would query the improvement in the structural cost metric if that sharing optimization were applied. If the structural cost improves, it would apply that optimization. If not, the optimization would continue to consider new opportunities for sharing circuits and evaluate them. In a similar fashion, decomposition, traditional technology mapping and buffering techniques are modified to operate with a structural optimization metric.

Figure 3A:
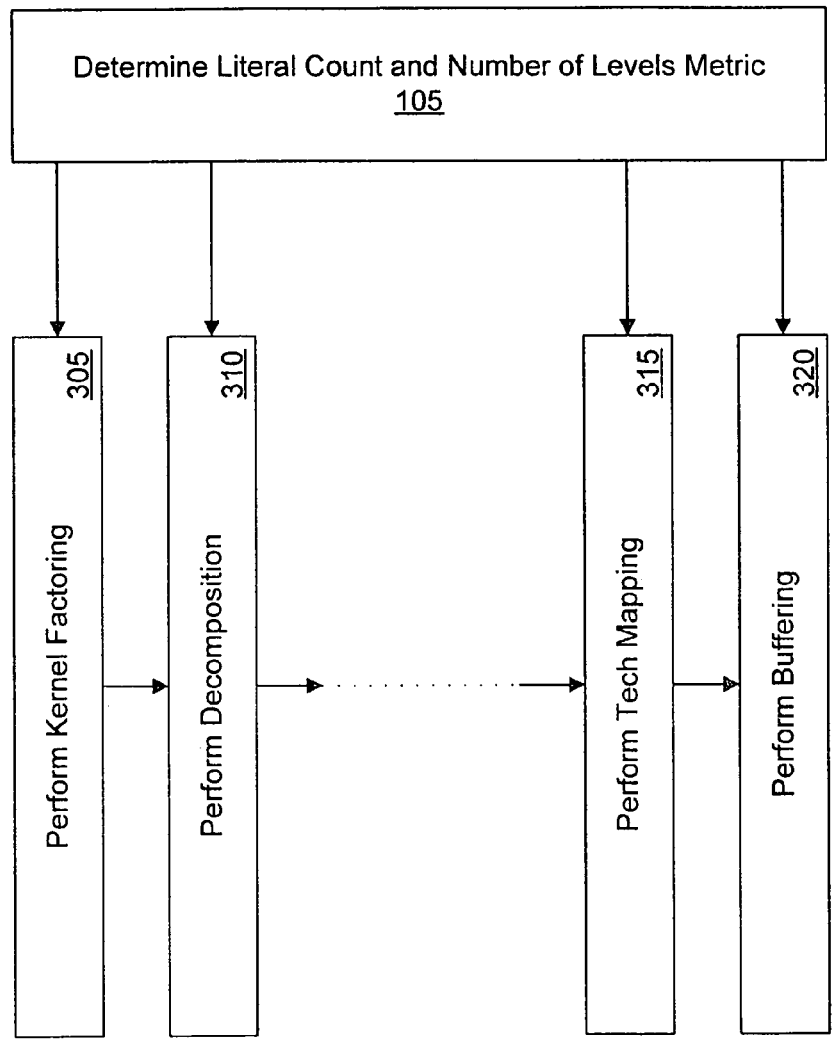
FIG. 3A shows a flow diagram of the prior art technology independent synthesis of FIG. 1, followed by technology mapping and buffering.

FIG. 1A shows a prior art design process 100. The design process 100 performs (at 105) logic synthesis. The input to the art design process is a register transfer level textual description of the design. The process optimizes the design for both boolean and physical characteristics and produces as output an design with circuits that are placed and mapped to technology gates from a standard cell library. As shown in FIG. 1, performing (at 105) the technology independent synthesis comprises determining (at 110) a literal count metric and a number of levels metric, which are used to evaluate the quality of the design. Referring now to FIG. 3A, performing (at 105) the technology independent synthesis further comprises performing (at 305) a kernel factoring, performing (at 310) a decomposition. The technology independent synthesis is followed by performing (at 315) a tech mapping, and performing (at 320) a buffering. It should be understood that the present invention is not limited to the transforms of kernel factoring and decomposition, tech mapping, and buffering. Other technology independent transforms may be used, as is contemplated by those skilled in the art.

Referring again to FIG. 1A, a technology dependent and physical synthesis is performed (at 115), which optimizes wire length and routability, as well as other metrics, such as timing and area. It is determined (at 120) whether the design is routable. It is also determined if the timing of the design is met. If the design is not routable or the timing goals of the design are not met because of routability, the design process 100 is repeated and a technology independent synthesis is performed (at 105) again. If the design is routable, a the design is sent to manufacturing.

Figure 2:
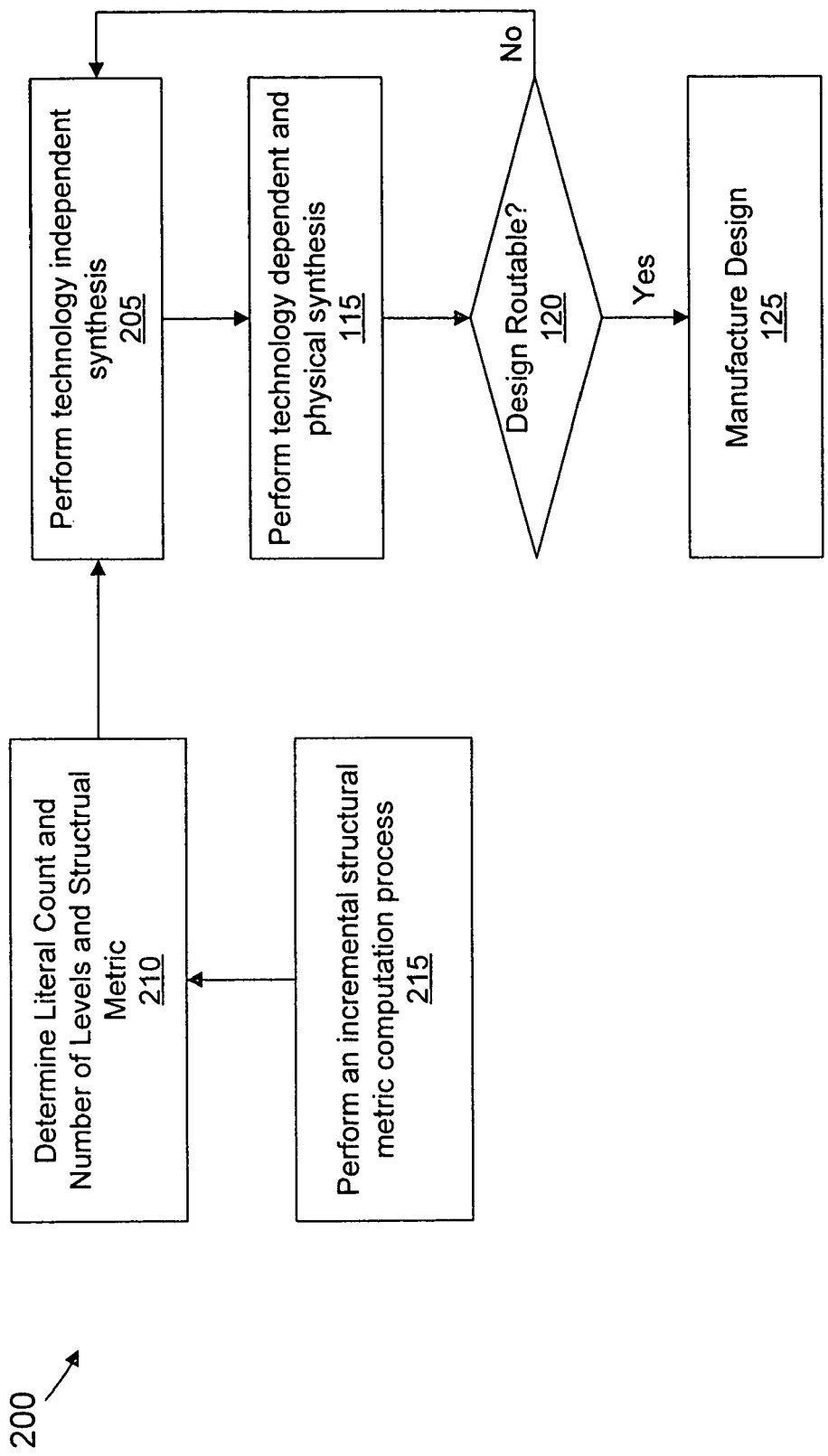
FIG. 2 shows a flow diagram of a structural logic design process, in accordance with one embodiment of the present invention.

FIG. 2 shows a structural design process 200, in accordance with one embodiment of the present invention. The structural design process 200 introduces a novel step of performing (at 205) a structural technology independent synthesis. As shown in FIG. 2, performing (at 205) the structural technology independent synthesis comprises determining (at 210) a structural metric, in addition to determining a literal count metric and a number of levels metric. The structural metric may be determined (at 210) in an incremental fashion. The structural metric may be any one of SAPMC ("sum of al-pairs min-cut"), distance, etc. As described in greater detail below, an incremental structural metric computation process is performed (at 215).

Referring now to FIG. 3B, performing (at 205) the structural technology independent synthesis further comprises performing (at 405) a structure-driven kernel factoring, performing (at 410) a structure-driven decomposition. The structural technology independent synthesis if followed by performing (at 415) a structure-driven tech mapping, and performing (at 420) a structure-aware buffering. It should be understood that the present invention is not limited to the structural transforms of structure-driven kernel factoring, structure-driven decomposition, structure-driven tech mapping, and structure-aware buffering. Other structural technology independent transforms may be used, as is contemplated by those skilled in the art.

Figure 4A:
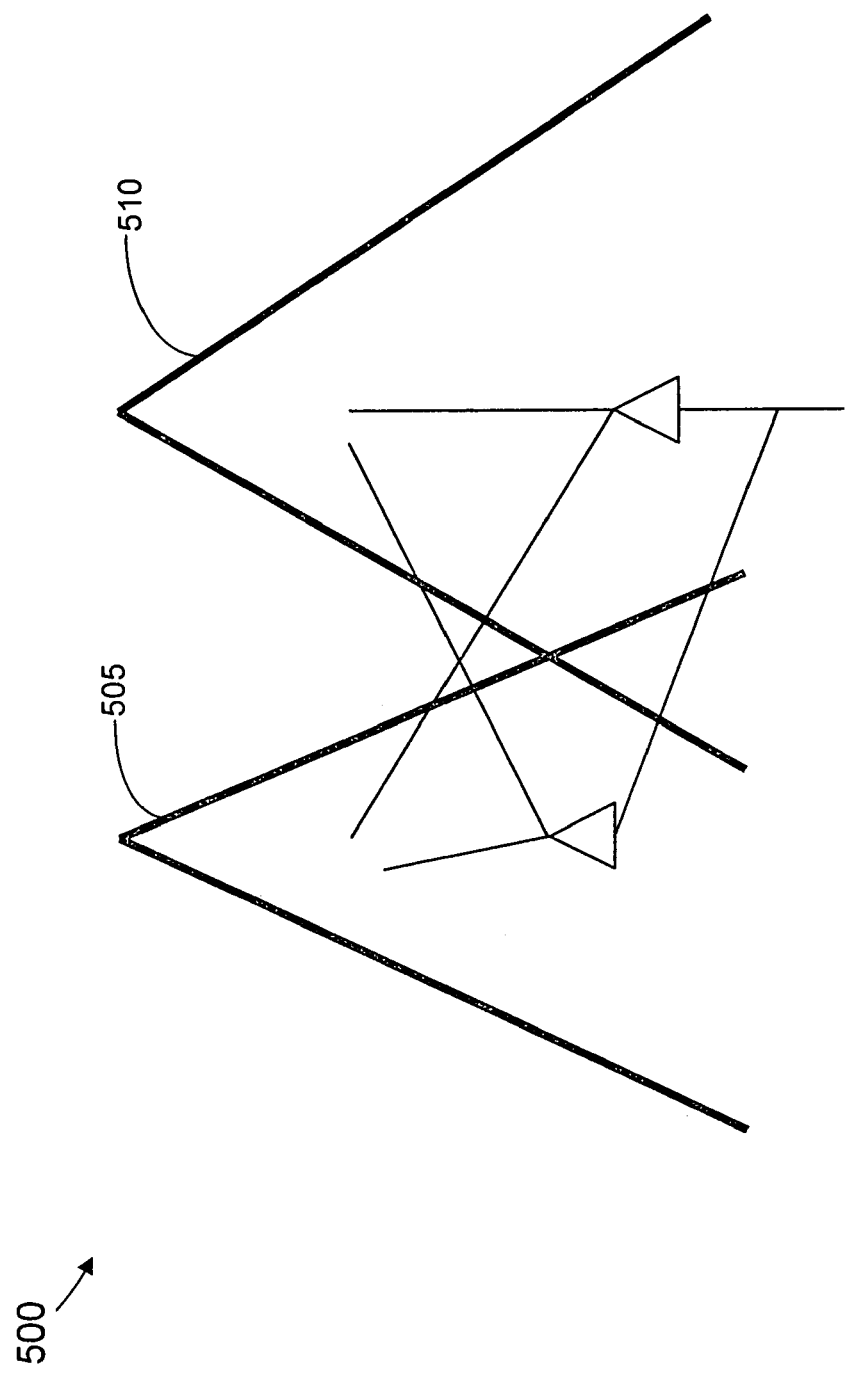
FIG. 4A shows a buffer tree constructed using the prior art buffering of FIG. 3A.

FIG. 4A shows a buffer tree 500 feeding into two cones of logic 505, 510, shown as triangular cones. The buffer tree 500 was constructed by performing (at 320) traditional buffering, as shown in FIG. 3A. FIG. 4B shows a buffer tree 600 that was constructed by performing (at 420) the structure-aware buffering technique feeding into the same two cones of logic 505, 510.

Figure 5:
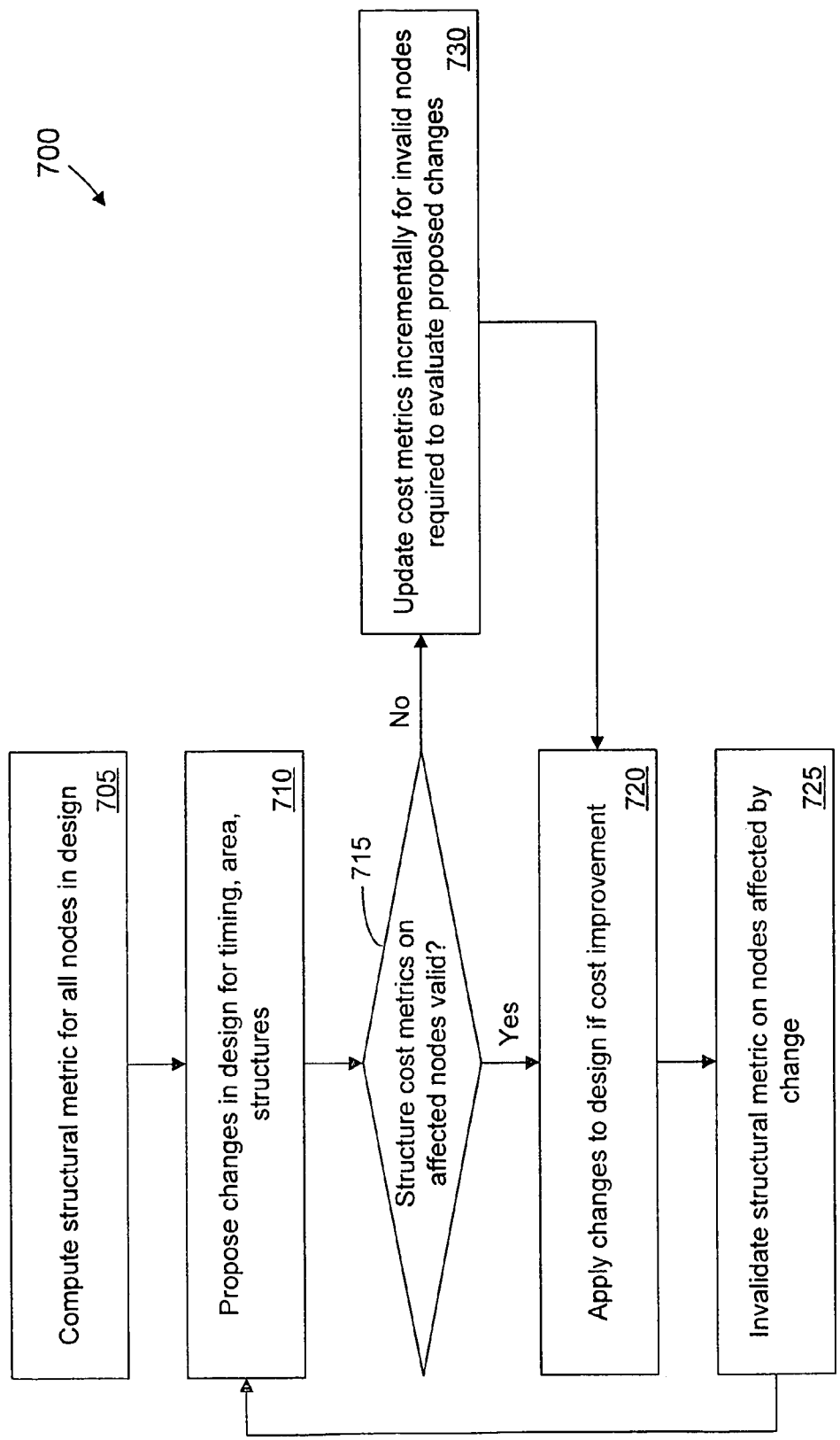
FIG. 5 shows a flow diagram of an incremental structural metric process, in accordance with one embodiment of the present invention.

FIG. 5 shows an incremental structure metric process 700 for determining a structural metric using a lazy evaluation technique, as shown in FIG. 2B. When a design is entered, the structural metric for all circuits in the design are determined (at 705). Design changes for time, area, and/or structure are proposed (at 710). It is determined (at 715) whether the structural metrics on the circuits that are affected by the design changes are valid. If they are valid, it is determined (at 720) if the design changes provide a cost improvement to the structural metric. If so, then the design changes are applied (at 725) to the design. If the structural metrics on the affected circuits are invalid, the affected circuits are updated (at 730) incrementally for the structural metrics. The structural metrics on the circuits affected by the change are invalidated (at 725). The incremental structural metric process 700 then re-proposes (at 710) new changes.

Figure 6B:
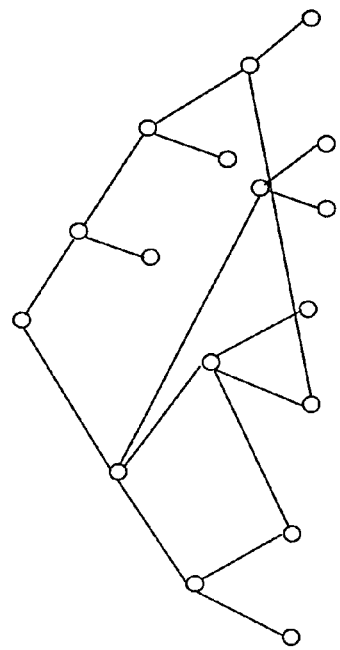
FIG. 6B shows the diagram of a graph representation of a design of FIG. 6A optimized with the prior art design process of FIGS. 1A and 1B.
Figure 6C:
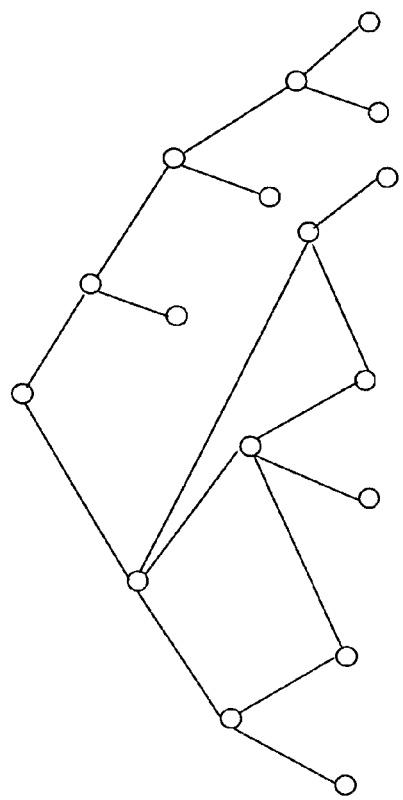
FIG. 6C shows the diagram of a graph representation of a design of FIG. 6A optimized with the structure design process of FIGS. 2A and 2B.
Figure 6A:
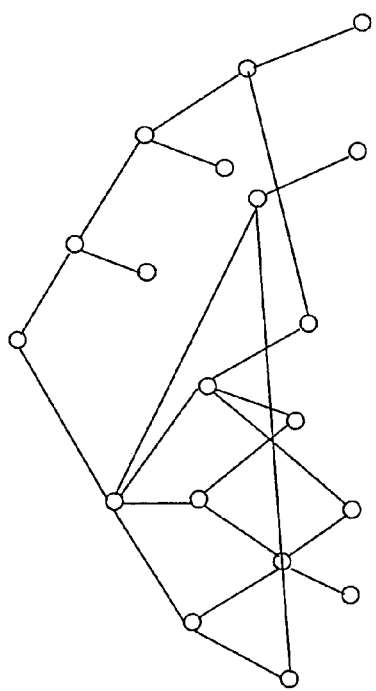
FIG. 6A shows an exemplary diagram of a graph representation of a design.

FIG. 6A shows a graph representation of a design. Each node represents a circuit and each edge represents a connection between two of the circuits. An optimized design using prior art, as illustrated in FIGS. 1A and 1B, is shown in FIG. 6B. The optimized design using the structural method, as illustrated in FIGS. 2A and 2B, is shown in FIG. 6C. Although both 6B and 6C have the same number of circuits, it is apparent that the design in FIG. 6C is improved for routability.

Figure 7B:
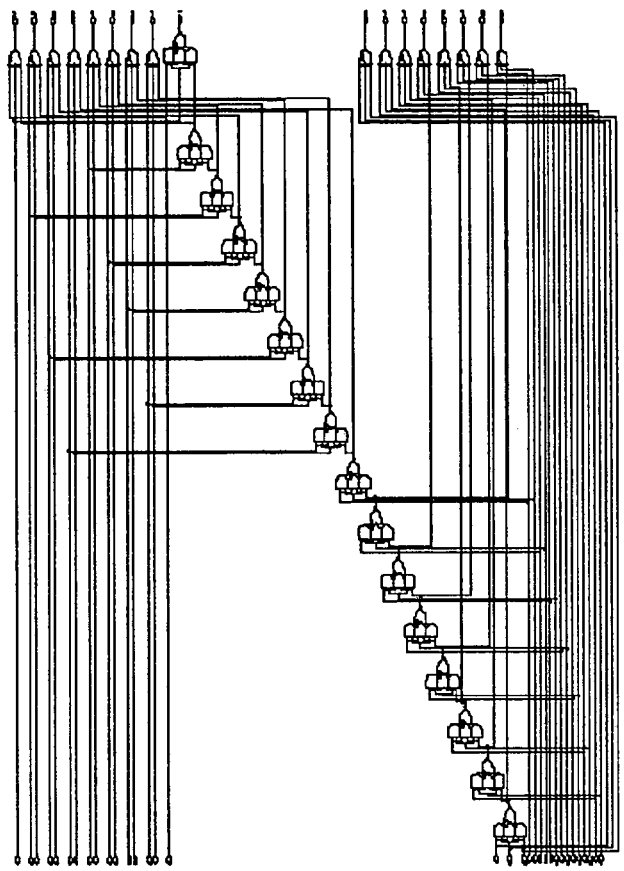
FIG. 7B shows a layout of a ripple carry adder, illustrating a structural metric, in accordance with one embodiment of the present invention.
Figure 7A:
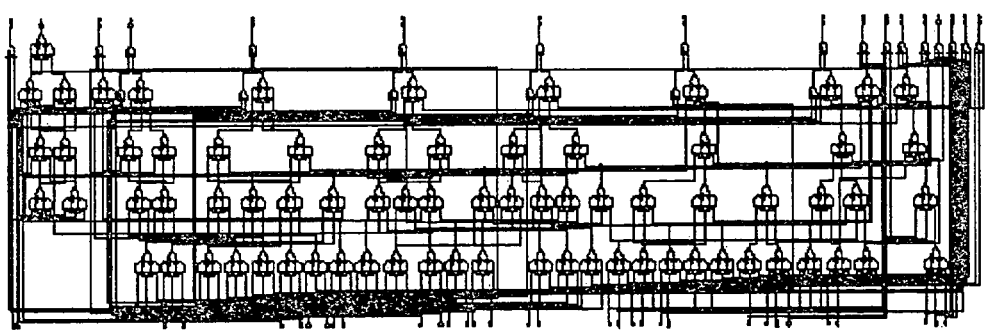
FIG. 7A shows a layout of a carry lookahead adder, illustrating a structural metric, in accordance with one embodiment of the present invention.
Figure 8:
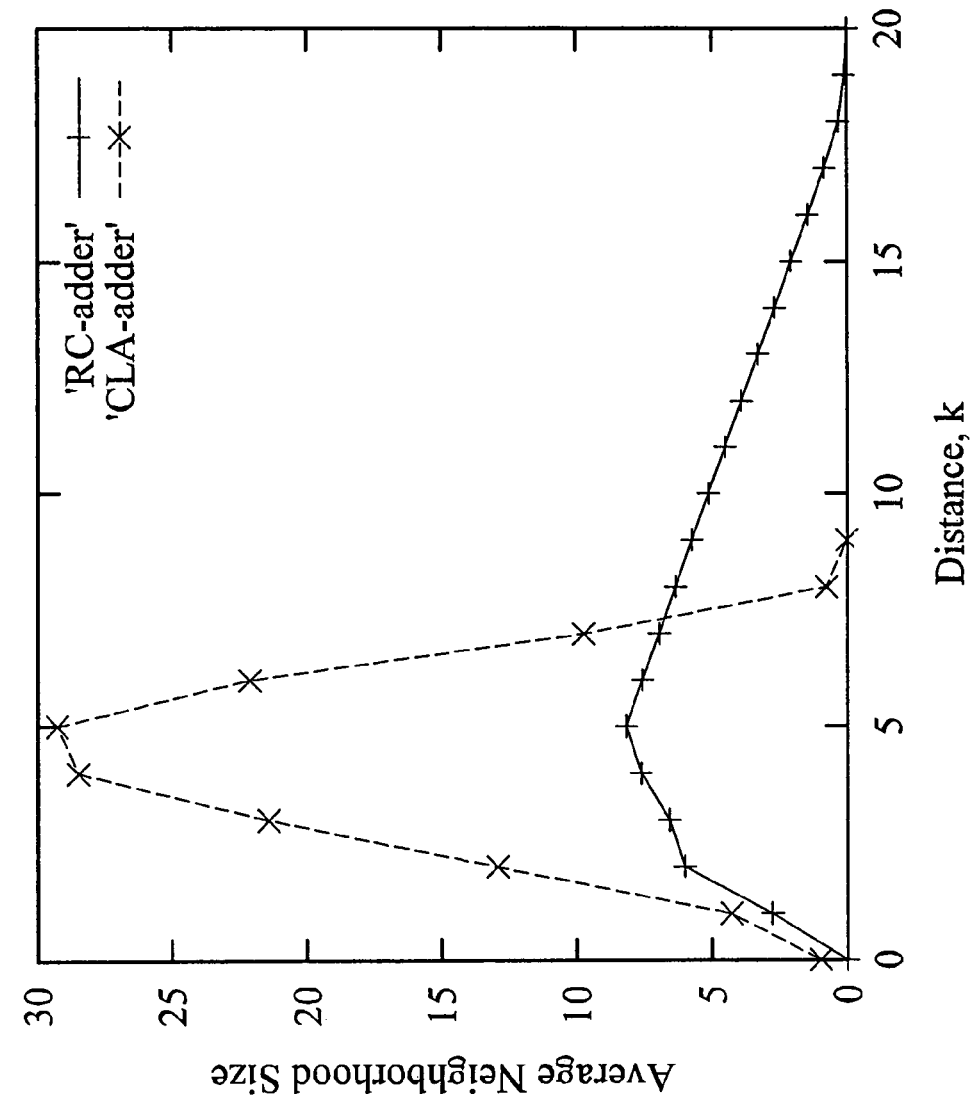
FIG. 8 shows an exemplary plot of the average neighborhood size over all circuits in the design for the carry lookahead adder of FIG. 7A and the ripple carry adder of FIG. 7B.

FIGS. 7A and 7B show two example circuit design models to illustrate the distance metric, in accordance with one embodiment of the present invention. FIG. 7A shows the schematic of a carry lookahead adder (hereinafter "CLA adder") and FIG. 7B shows a ripple carry adder. For each circuit in the design, neighbors are computed at distances 1, 2, 3, and so on for both adders. Referring now to FIG. 8, the average neighborhood size over all circuits in the design are plotted for both the ripple carry adder and the CLA adder. The CLA adder has more neighbors at smaller distances, while the ripple carry adder has a wider spread of neighborhood. The difference in structural metrics of the two adders correspond well with their routability characteristics.

As follows from the plotted curves of FIG. 8, the carry-lookahead structure has a significantly larger neighborhood population for almost all of its distances compared to ripple-carry structure. Such comparison is consistent with the fact that ripple-carry adder produces better for yield layouts. In general, during circuit restructuring the objective is to minimize the neighborhood population numbers for smaller values of distance k, while allowing their increase for larger distances. Such optimization reduces congestion at the immediate vicinity of a change, and distributes it across the extended neighborhood.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A computer-implemented method for designing circuits, comprising:
   receiving a register transfer level (RTL) textual description of a circuit design model as input to a logical synthesis stage; and
   performing logical synthesis using the RTL textual description, the logical synthesis being performed before assigning physical locations to the circuits, wherein performing logical synthesis comprises:
   generating a logic network from the RTL textual description of the circuit design model;
   determining a structural metric through an analysis of the logic network, wherein the structural metric is a measure of wiring congestion of the circuit design model; and
   using the structural metric during a technology independent synthesis stage of the logical synthesis to predict wiring congestion of the circuit design model to optimize the circuit design model.

2. The method of claim 1, wherein using the structural metric to optimize the circuit design model comprises adding, deleting or substituting one or more circuits using a combination of boolean, algebraic and electrical optimizations.

3. The method of claim 1, wherein the structural metric includes a measure of routing congestion of the circuit design model after placement and routing, the routing congestion being measured by an average and a peak number of wires crossing any bisection of the placed and routed circuit design model.

4. The method of claim 1, wherein using the structural metric to optimize the circuit design model comprises using the structural metric during a technology mapping stage of the logic synthesis stage.

5. The method of claim 1, wherein using the structural metric to optimize the circuit design model comprises using the structural metric during a buffering stage of the logic synthesis stage.

6. The method of claim 1, further comprising incrementally updating the structural metric when logic changes are made to the circuit design model.

7. The method of claim 6, wherein incrementally updating the structural metric when logic changes are made to the circuit design model comprises performing recomputation on circuits involved in an optimization and circuits affected by the optimization to provide a structural metric cost.

8. The method as in claim 6, wherein incrementally updating the structural metric when logic changes are made to the circuit design model comprises maintaining information regarding circuits affected by an optimization, which are computed when recomputation of the structural metric is necessary.

9. The method of claim 1, wherein the structural metric comprises any one of a distance metric, a sum-of-all-pairs-min-cut ("SAPMC"), and an expansion metric.

10. The method of claim 1, wherein determining a structural metric comprises:
   generating one or more possible optimizations;
   incrementally updating the structural metric when the optimizations are made to the circuit design model to evaluate the cost of applying each of the one or more possible optimizations to the circuit design model, the structural metric comprising any one of a distance metric, a sum-of-all-pairs-min-cut ("SAPMC"), and an expansion metric;

evaluating a structural metric cost of each of the one or more possible optimizations as given by the structural metric;

selecting an optimization from the one or more possible optimizations with the lowest structural metric cost; and applying the optimization to the circuit design model.

11. The method of claim 10, wherein generating the one or more possible optimizations comprises:

generating a structure-driven kernel factoring;

generating a structure-driven decomposition;

generating a structure-driven tech mapping; and generating a structure-aware buffering.

12. A program storage device readable by machine, tangibly embodying a program of instructions executable by the machine to perform method steps for optimizing a circuit design model the method steps comprising:

receiving a register transfer level (RTL) textual description of a circuit design model as input to a logical synthesis stage; and performing logical synthesis using the RTL textual description, the logical synthesis being performed before assigning physical locations to the circuits, wherein performing logical synthesis comprises:

generating a logic network from the RTL textual description of the circuit design model;

determining a structural metric through an analysis of the logic network, wherein the structural metric is a measure of wiring congestion of the circuit design model; and using the structural metric during a technology independent synthesis stage of the logical synthesis to predict wiring congestion of the circuit design model to optimize the circuit design model.

13. The program storage device of claim 12, wherein the structural metric includes a measure of routing congestion of the circuit design model after placement and routing, the routing congestion being measured by an average and a peak number of wires crossing any bisection of the placed and routed circuit design model.

14. The program storage device of claim 12, wherein the method steps further comprise incrementally updating the structural metric when logic changes are made to the circuit design model.

15. The program storage device of 14, wherein incrementally updating the structural metric when logic changes are made to the circuit design model comprises performing recomputation on circuits involved in an optimization and circuits affected by the optimization to provide a structural metric cost.

16. The program storage device of 14, wherein incrementally updating the structural metric when logic changes are made to the circuit design model comprises maintaining information regarding circuits affected by an optimization, which are computed when recomputation of the structural metric is necessary.

17. The program storage device of 12, wherein the structural metric comprises any one of a distance metric, a sum-of-all-pairs-min-cut ("SAPMC"), and an expansion metric.

18. The program storage device of 12, wherein determining a structural metric comprises:

generating one or more possible optimizations;

incrementally updating the structural metric when the optimizations are made to the circuit design model to evaluate the cost of applying each of the one or more possible optimizations to the circuit design model, the structural metric comprising any one of a distance metric, a sum-of-all-pairs-min-cut ("SAPMC"), and an expansion metric;

evaluating a structural metric cost of each of the one or more possible optimizations as given by the structural metric;

selecting an optimization from the one or more possible optimizations with the lowest structural metric cost; and applying the optimization to the circuit design model.

19. A system for designing circuits, comprising:

means for creating a structural metric from a logic network during logical synthesis of a circuit design model, wherein the logic network is derived from a register transfer level (RTL) textual description of the circuit design model, and the structural metric is a measure of wiring congestion of the circuit design model; and means for using the structural metric during a technology independent synthesis stage of the logic synthesis to predict wiring congestion of the circuit design model to optimize the circuit design model, wherein the creating and using are performed before assigning physical locations to the circuits.

* * * * *